United States Patent
Otanicar et al.

(10) Patent No.: US 11,125,469 B2
(45) Date of Patent: Sep. 21, 2021

(54) APPARATUS AND METHOD FOR THE CO-PRODUCTION OF HIGH TEMPERATURE THERMAL ENERGY AND ELECTRICAL ENERGY FROM SOLAR IRRADIANCE

(71) Applicant: The University of Tulsa, Tulsa, OK (US)

(72) Inventors: Todd P. Otanicar, Tulsa, OK (US); Drew DeJarnette, Tulsa, OK (US); Nick Brekke, Tulsa, OK (US)

(73) Assignee: The University of Tulsa, Tulsa, OK (US)

( * ) Notice: Subject to any disclaimer, the term of this patent is extended or adjusted under 35 U.S.C. 154(b) by 0 days.

(21) Appl. No.: 16/074,954

(22) PCT Filed: Feb. 2, 2017

(86) PCT No.: PCT/US2017/016241
§ 371 (c)(1),
(2) Date: Aug. 2, 2018

(87) PCT Pub. No.: WO2017/136569
PCT Pub. Date: Aug. 10, 2017

(65) Prior Publication Data
US 2019/0049152 A1 Feb. 14, 2019

Related U.S. Application Data

(60) Provisional application No. 62/290,247, filed on Feb. 2, 2016.

(51) Int. Cl.
*F24S 10/25* (2018.01)
*F24S 80/20* (2018.01)
(Continued)

(52) U.S. Cl.
CPC ............... *F24S 10/25* (2018.05); *F24S 20/20* (2018.05); *F24S 80/20* (2018.05); *H01L 31/04* (2013.01);
(Continued)

(58) Field of Classification Search
None
See application file for complete search history.

(56) References Cited

U.S. PATENT DOCUMENTS 3,952,724 A * 4/1976 Pei .......................... F24S 10/45
126/655
4,099,513 A * 7/1978 Skrivseth ................ F24S 10/50
126/667

(Continued)

OTHER PUBLICATIONS

Brekke et al., "A Parametric Investigation of a Concentrating Photovoltaic-Thermal System with Spectral Filtering Utilizing a Two-Dimensional Heat Transfer Model", Apr. 2016, vol. 138—021007-1, Publisher: Journal of Solar Energy Engineering copyright 2016 by ASME; URL: http://journals.cambridge.org/abstract_S2059852116004394.

(Continued)

*Primary Examiner* — Eli S Mekhlin
(74) *Attorney, Agent, or Firm* — GableGotwals (57) ABSTRACT

An apparatus (10) and method for the co-production of high temperature thermal energy and electrical energy from solar irradiance includes a photovoltaic cell (30) laminated to a metal extrusion device (40) and a transparent channel (20) in front of the photovoltaic cell (30). The transparent channel (20) contains a heat transfer fluid that is seeded with metallic, semiconducting, and/or non-metallic nanoparticles and absorbs wavelengths of solar energy that are not utilized or underutilized by the photovoltaic cell (30).

19 Claims, 9 Drawing Sheets

(51) Int. Cl.
*F24S 20/20* (2018.01)
*H01L 31/052* (2014.01)
*H01L 31/054* (2014.01)
*H01L 31/04* (2014.01)
*F24S 80/00* (2018.01)

(52) U.S. Cl.
CPC ........ *H01L 31/054* (2014.12); *H01L 31/0521* (2013.01); *H01L 31/0547* (2014.12); *F24S 2080/03* (2018.05); *Y02E 10/40* (2013.01); *Y02E 10/44* (2013.01); *Y02E 10/52* (2013.01); *Y02P 80/15* (2015.11)

(56) References Cited

U.S. PATENT DOCUMENTS

| | | | |
|---|---|---|---|
| 4,223,174 A | 9/1980 | Moeller | |
| 4,320,246 A * | 3/1982 | Russell | F28D 15/04 136/248 |
| 4,373,308 A * | 2/1983 | Whittaker | F24S 10/50 52/173.3 |
| 4,491,681 A | 1/1985 | Kirpich | |
| 2008/0245403 A1* | 10/2008 | Stimson | F24S 10/75 136/248 |
| 2010/0018567 A1* | 1/2010 | Sakurai | F24S 23/82 136/246 |
| 2011/0011802 A1* | 1/2011 | Maydan | C02F 1/02 210/652 |
| 2011/0186109 A1* | 8/2011 | Elazari | H02S 20/25 136/248 |
| 2012/0060898 A1* | 3/2012 | Ahlgren | H01L 31/042 136/248 |
| 2014/0041710 A1* | 2/2014 | Hwang | F28D 15/0266 136/246 |
| 2015/0229267 A1* | 8/2015 | Hilliard | H02S 40/44 136/248 |

OTHER PUBLICATIONS

DeJarnette et al., "Solar Energy Materials & Solar Cells", 2016, pp. 145-153.

DeJarnette et al., "Selective spectral filtration with nanoparticles for concentrating solar collectors", 2015, vol. 5, Publisher: Journla of Photonics for Energy 057008-1.

Otanicar et al, "Full Spectrum Collection of Concentrated Solar Energy Using PV Coupled with Selective Filtration Utilizing Nanoparticles", Jun. 2016, pp. 1-6, Publisher: MRS Advances; Available on CJO 2016 doi: 10.1557; adv.2016.439.

Otanicar et al, "Parametric analysis of a coupled photovoltaic/ thermal concentrating solar collector for electricity generation",, Publisher: Journal of Applied Physics 108, 114907 (2010).

Taylor et al, "Nanofluid-based optical filter optimization for PV/T systems", Mar. 19, 2012, Publisher: Light: Science & Applications (2012) 1, e34; doi: 10.I1038/lsa.2012.34 2012 CIOMP. allrights reserved 2047-7538-12.

DaJarnette et al., "Selective spectral filtration with nanoparticles for concentrating solar collectors", Feb. 2015, pp. 1-14, Publisher: Journal of Photonics for Energy; URL: https://www.researchgate.net/publication/273486087.

DaJarnette et al, "Design and feasibility of high temperature nanoparticle fluid filter in hybrid thermal/photovoltaic concentrating solar power", Sep. 2015, pp. 1-9, Publisher: Conference Paper; URL: <https://www.researchgate.net/publication/281746232>.

* cited by examiner

(a) Coupled (b) De-Coupled

APPARATUS AND METHOD FOR THE CO-PRODUCTION OF HIGH TEMPERATURE THERMAL ENERGY AND ELECTRICAL ENERGY FROM SOLAR IRRADIANCE

CROSS-REFERENCE TO RELATED APPLICATIONS

This application is the United States National Phase of Patent Application No. PCT/US2017/016241 filed 2 Feb. 2017, which claims priority to U.S. Provisional Application No. 62/290,247 filed 2 Feb. 2016 each of which are incorporated herein by reference.

FIELD OF INVENTION

This disclosure relates to the field of energy generation from solar irradiance and, more particularly, to an apparatus and method for the co-production of high temperature thermal energy and electricity from solar energy.

BACKGROUND OF THE INVENTION

Current solar energy systems account for one percent (1%) of electricity production in the United States. The majority of this is generated by photovoltaic ("PV") systems that directly convert incoming photons to electricity. The remainder is generated by concentrated solar power ("CSP") systems that convert solar energy into heat, which is then used to drive a steam turbine connected to an electrical power generator. The costs of generating electricity with photovoltaic systems are competitive with conventional sources, but, due to the costs of electrical storage, photovoltaic systems can only be used in daylight hours. Concentrated solar power systems can easily store heat as thermal energy and dispatch it at later times, but are more expensive than photovoltaic systems. There is a need for a hybrid solar energy system that can capture the full solar spectrum at low cost and that has the capacity for storage and subsequent dispatch.

SUMMARY OF THE INVENTION

An apparatus for the co-production of high temperature thermal energy and electrical energy from solar irradiance includes a photovoltaic cell laminated to a metal extrusion device and a transparent channel in front of the photovoltaic cell. The transparent channel contains a heat transfer fluid that is seeded with metallic, semiconducting, and/or non-metallic nanoparticles and absorbs wavelengths of solar energy that are not utilized or underutilized by the photovoltaic cell.

A method for the co-production of high temperature thermal energy and electrical energy from solar irradiance includes the steps of providing an apparatus with a photovoltaic cell laminated to a metal extrusion device and a transparent channel in front of the photovoltaic cell, flowing a heat transfer fluid through an extrusion channel in the metal extrusion device, flowing a heat transfer fluid through the transparent channel, and exposing the apparatus to solar energy. The photovoltaic cell converts a portion of the solar energy to electrical energy, while another portion of the solar energy is absorbed as thermal energy by the heat transfer fluid as it passes through the transparent channel.

DETAILED DESCRIPTION OF THE PREFERRED EMBODIMENTS

The preferred embodiments of an apparatus and method for the co-production of high temperature thermal energy and electrical energy from solar irradiance allow users to capture the full solar spectrum at low cost and to store and subsequently dispatch energy. The solar energy may be used for stand-alone electricity generation or in situations where both electricity and process heat are needed. Initial design modeling shows that the apparatus and method may reduce the cost of producing electricity by ten percent (10%) in comparison to conventional concentrated solar power systems.

Figure 1:
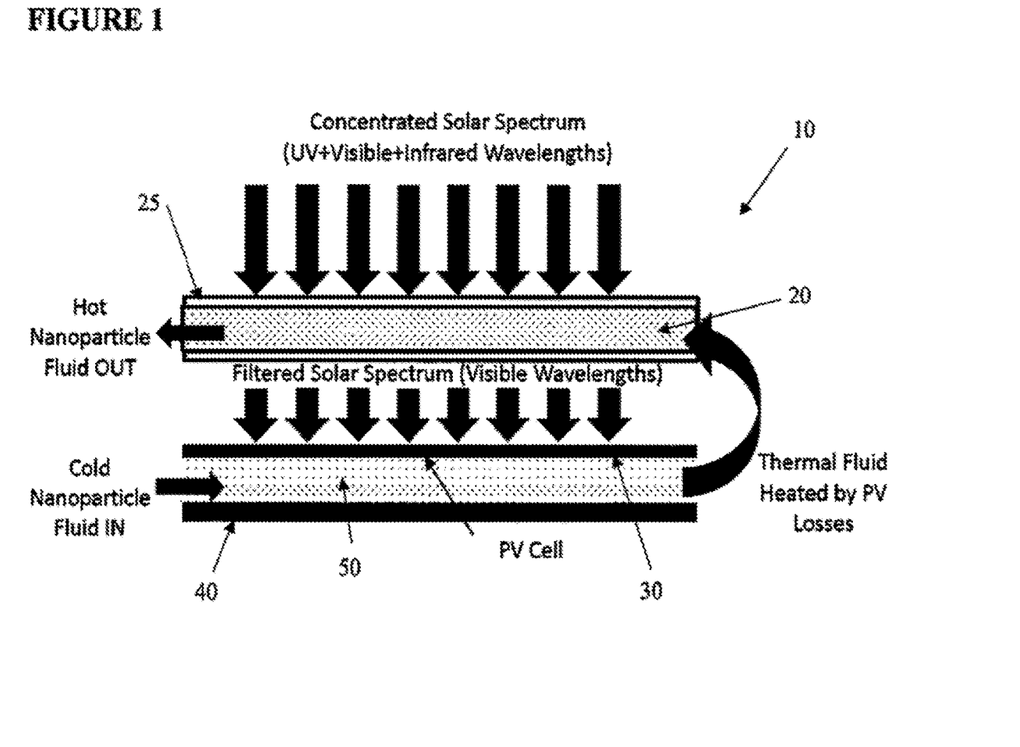
FIG. 1 is a diagram of an embodiment of an apparatus for the co-production of high temperature thermal energy and electrical energy from solar irradiance.

As shown in FIG. 1, an embodiment of the apparatus 10 includes a transparent channel 20 containing a heat transfer fluid that is capable of withstanding high temperature and is seeded with a combination of metallic, semiconducting, and/or non-metallic nanoparticles. The selection of one or more types of nanoparticle may be based on multiple factors, including but not limited to the photovoltaic cell band gap and the desired ratio between thermal and electrical outputs. The concentration of the selected nanoparticle may also be based on multiple factors, including but not limited to how strongly the nanoparticle absorbs energy, the wavelength for peak absorption, and the optical path length or thickness of the transparent channel.

The transparent channel 20 is installed in front of a photovoltaic cell 30, and the photovoltaic cell 30 is laminated to a metal extrusion device 40. The metal extrusion device 40 provides support for the photovoltaic cell 30 and contains an extrusion channel 50 through which a heat transfer fluid flows. The extrusion channel 50 may be directly coupled to the transparent channel 20 via a pipe (not shown), in which case the heat transfer fluid flowing through the transparent and extrusion channels is the same, or de-coupled through a heat exchanger (not shown), in which case the heat transfer fluids flowing through the transparent and extrusion channels may be different and/or flow at different rates. The apparatus 10 is supported by a structure (not shown) that allows for tracking of the sun throughout the day and year. The transparent channel 20 may be made of glass, clear plastic, or any other transparent material known in the industry. The metal extrusion device 40 may be, but does not have to be, made of aluminum. The extrusion channel 50 may have a total height "H" and include a plurality of flow sections 51, each flow section 51 defined by a pair of end walls 53 having a total height "$H_E$" equal to the total height H of the extrusion channel 50 and a plurality of intermediate walls 55 located between the pair of end walls 53, the intermediate walls 55 spaced apart from one another and having a total height "$H_1$" less than the total height H of the extrusion channel 50.

Figure 2:
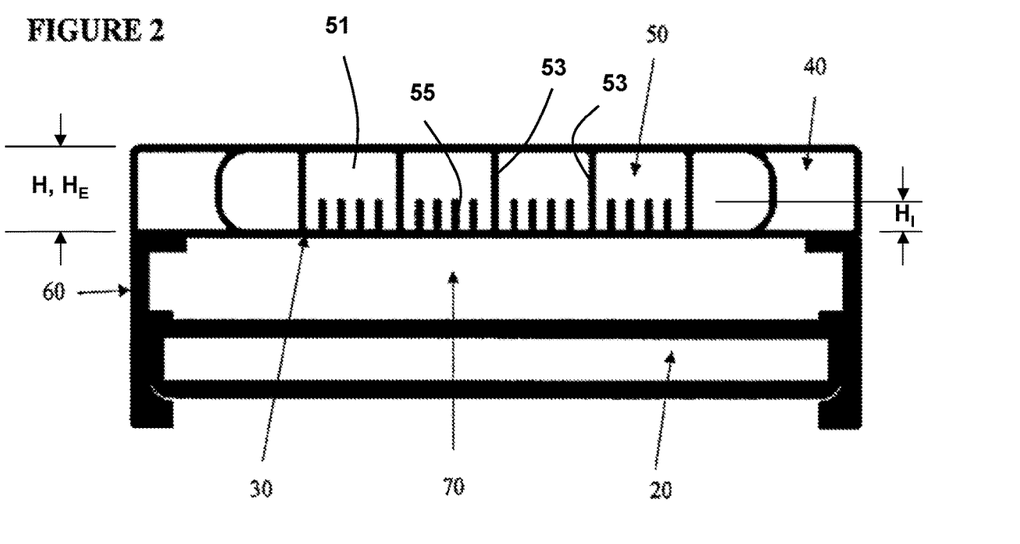
FIG. 2 is a cross-sectional view of the apparatus, showing one potential configuration of the transparent channel, photovoltaic cell, and metal extrusion device.
Figure 3:
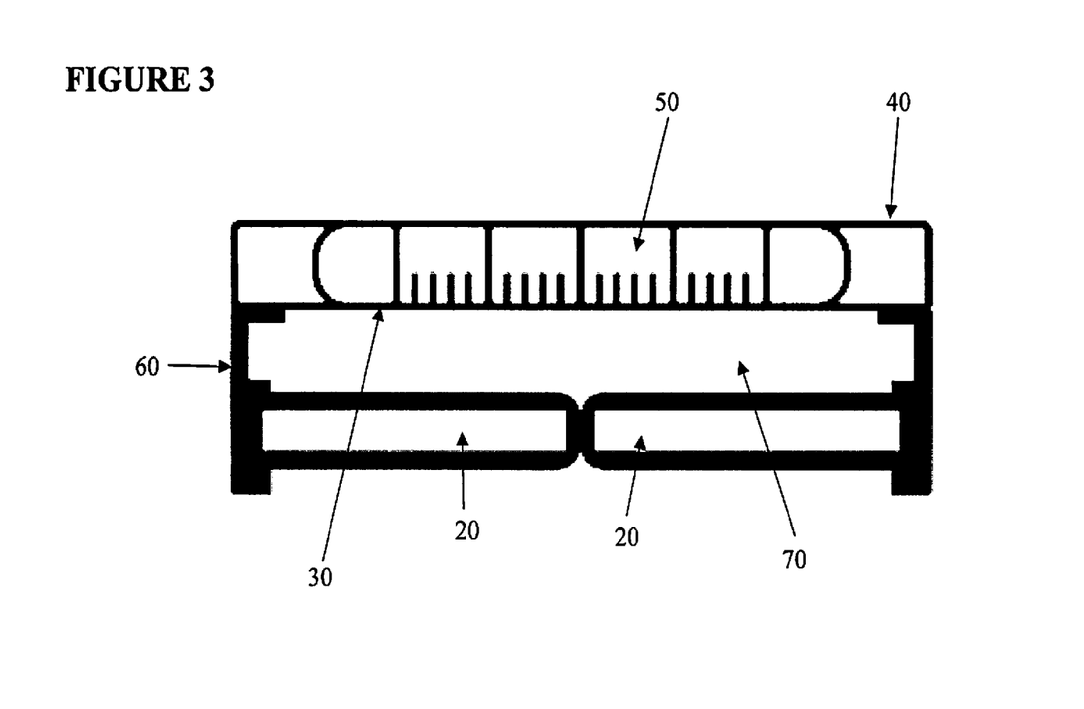
FIG. 3 is a cross-sectional view of the apparatus, showing another potential configuration of the transparent channel, photovoltaic cell, and metal extrusion device.
Figure 4:
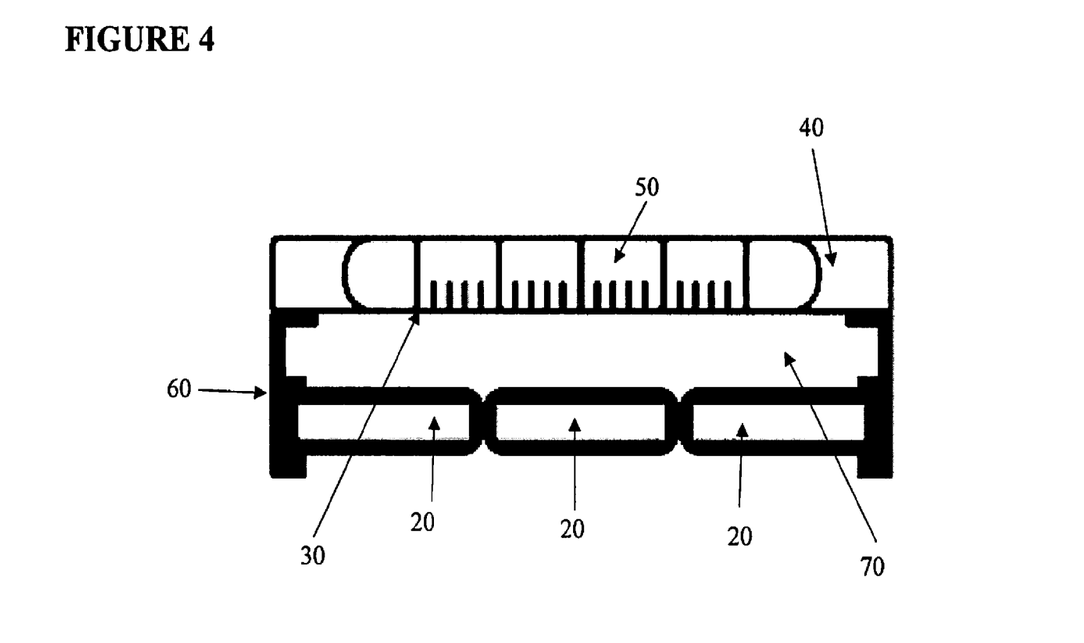
FIG. 4 is a cross-sectional view of the apparatus, showing another potential configuration of the transparent channel, photovoltaic cell, and metal extrusion device.

Alternative configurations of the transparent channel 20, photovoltaic cell 30, and metal extrusion device 40 are shown in FIGS. 2-4. These designs represent the apparatus as designed to work with linear Fresnel or segmented parabolic trough type non-imaging concentration systems. In FIGS. 2-4, the upper component represents the metal extrusion device 40 upon which the photovoltaic cell 30 is laminated and to which the transparent channel 20 is attached by one or more supports 60. In FIG. 2, the transparent channel 20 is comprised of one single piece which contains the heat transfer fluid. In FIGS. 3-4, the transparent channel 20 is comprised of multiple separate components to limit the stress concentrations that may arise from pressures within a single component.

Figure 5:
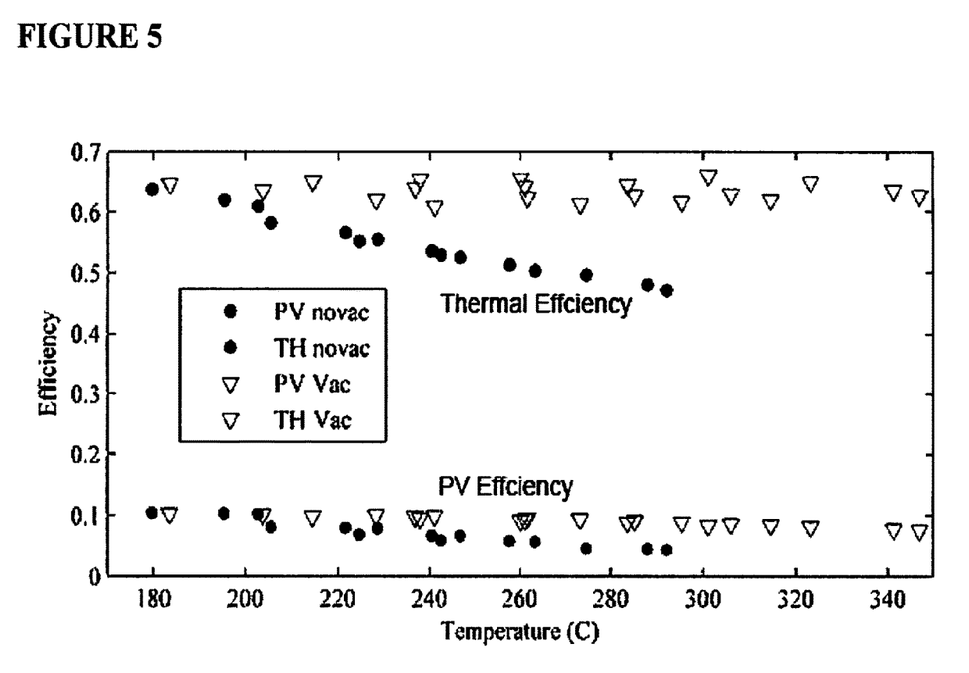
FIG. 5 compares the performance of photovoltaic and thermal portions of a de-coupled apparatus, with and without vacuum insulation, across a range of temperatures.

The gap 70 between the transparent channel 20 and the metal extrusion device 40 may be made of air, a vacuum, or a highly transparent insulating slab that limits heat transfer between the two components. FIG. 5 shows the relative efficiencies for the thermal and photovoltaic portions of a de-coupled apparatus, as represented in the embodiments shown in FIGS. 2-4, with and without vacuum insulation in the gap 70 between the transparent channel 20 and the extrusion channel 50. For the photovoltaic portion of the apparatus, the efficiency with vacuum insulation remains relatively constant, while the efficiency without vacuum insulation is comparable to that of vacuum insulation at lower temperatures but decreases as the temperature increases. For the thermal portion of the apparatus, the efficiency with vacuum insulation again remains relatively constant, while the efficiency without vacuum insulation decreases as the temperature rises.

The outer surface 25 of the transparent channel 20 may be coated with a low emissivity coating, such as indium tin oxide ("ITO"), to lower radiative heat losses. Although the ITO coating decreases the transmission of the transparent channel 20, the overall energy gain is positive because the radiation losses are significantly decreased. The base of the extrusion channel 50 may be coated with an anti-reflection coating to limit reflection losses, while the sides of the transparent channel 20 and the extrusion channel 50 may be insulated to reduce heat loss to the atmosphere.

Figure 6:
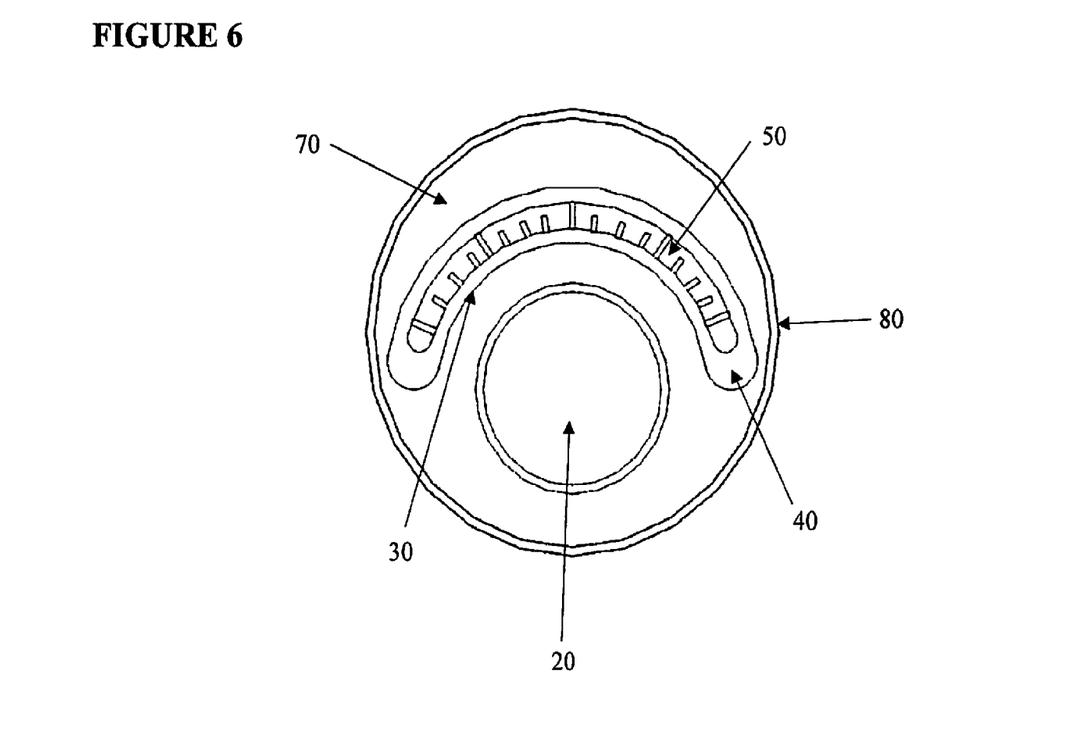
FIG. 6 is a cross-sectional view of the apparatus, showing one potential configuration that may be used as "drop-in" replacement architecture for a conventional CSP system.
Figure 7:
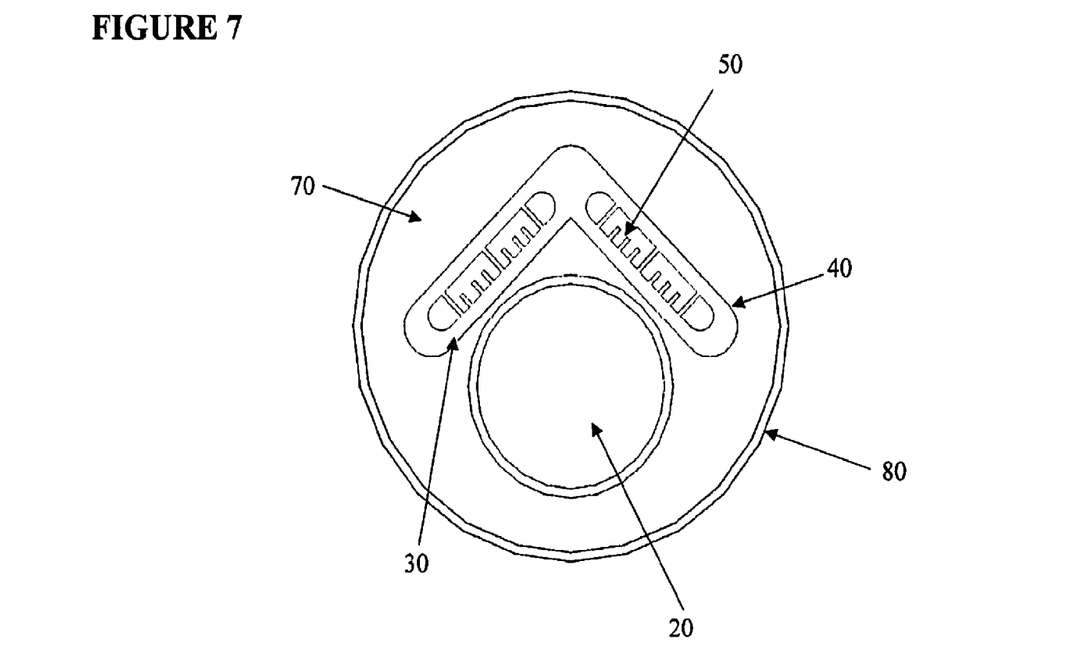
FIG. 7 is a cross-sectional view of the apparatus, showing another potential configuration that may be used as "drop-in" replacement architecture for a conventional CSP system.

FIGS. 6-9 represent alternative configurations that may be used as "drop-in" replacement architecture for conventional CSP systems. In FIGS. 6-7, a tube of similar geometry and construction to that of a conventional CSP absorber tube is envisioned where an transparent tube 80 envelops two inner components. One inner component is the transparent channel 20 containing the nanoparticle-seeded heat transfer fluid, and the second inner component is the metal extrusion device 40 with the photovoltaic cell 30. As shown in FIG. 6, the metal extrusion device 40 may be curved to maximize space usage within the tube 80. This configuration also reduces reflection losses from high incident angle light impacting the photovoltaic cell 30 and maximizes any back reflection into the transparent channel 20. This embodiment is intended for use with flexible PV cells. FIG. 7 shows a similar configuration but with a V-shaped metal extrusion device 40 that may be more suitable for use with non-flexible cells.

FIGS. 6-7 are advantageous since the entire tube 80 may be used to replace current absorber tubes in CSP plants while (unlike conventional tubes) cogenerating thermal energy and electricity. In addition, enveloping the transparent channel 20 and/or metal extrusion device 40 in the tube 80 reduces heat losses, and the circular geometry of the tube 80 allows for higher working pressures of the fluid. As an example, the circular geometry may allow an internal fluid pressure of 100 or more pounds per square inch ("psi"). Reaching similar pressures with an alternate geometry would require increasing the thickness of the tube.

Figure 8:
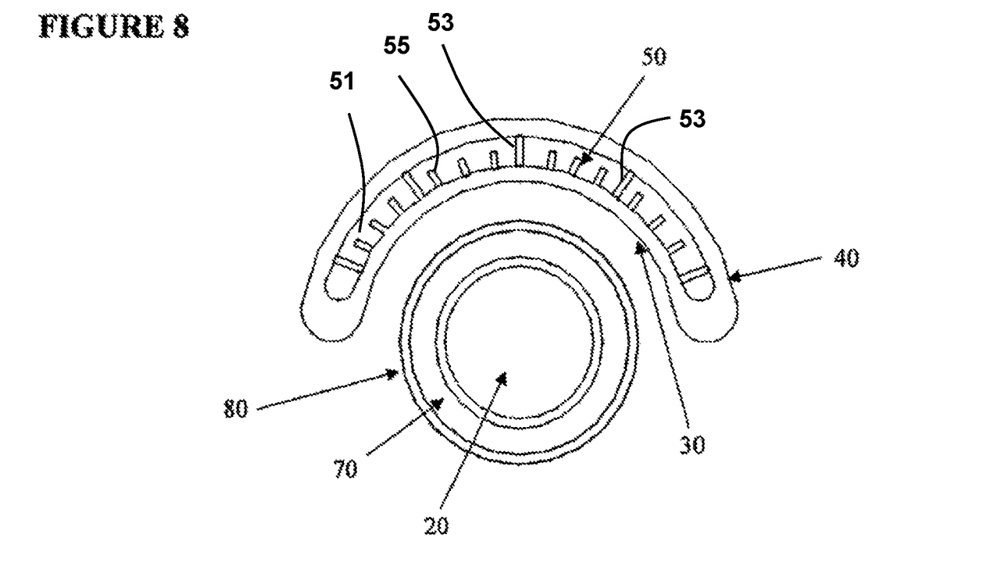
FIG. 8 is a cross-sectional view of the apparatus, showing another potential configuration that may be used as "drop-in" replacement architecture for a conventional CSP system.
Figure 9:
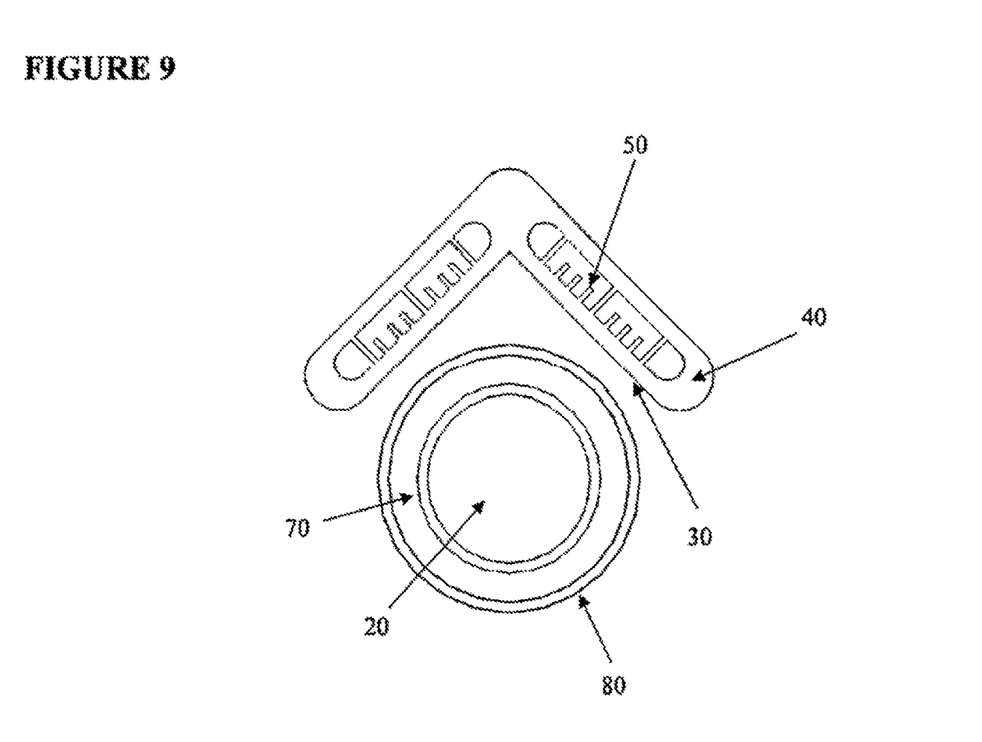
FIG. 9 is a cross-sectional view of the apparatus, showing another potential configuration that may be used as "drop-in" replacement architecture for a conventional CSP system.

FIGS. 8-9 are alternative configurations that could also be used as "drop-in" replacement architecture for conventional CSP systems. In FIGS. 8-9, the metal extrusion device 40 is placed outside the transparent tube 80. These configurations are similar in construction to current CSP systems, are easier to install and manufacture than the configurations shown in FIGS. 6-7, and allow for cooling of the photovoltaic components. However, additional mechanisms (not shown) are required to attach the metal extrusion device to the supports holding the current absorber tubes.

Anti-reflective and low-emissivity coatings may be used on all transparent surfaces of the drop-in configurations shown in FIGS. 6-9, and the sides and base of the extrusion channel 50 may be insulated. The gap between the transparent channel 20 and the transparent tube 80 may be vacuum insulated. FIG. 5 shows the relative efficiencies for the thermal and photovoltaic portions of the drop-in configurations, as represented by the embodiments shown in FIGS. 6-9, with and without vacuum insulation in the gap 70.

The apparatus receives concentrated solar flux from a concentrating mirror or set of mirrors in either a parabolic shape or as a set of Fresnel reflectors that direct light onto the transparent channel 20 and the photovoltaic cell 30. The nanoparticles in the heat transfer fluid in the transparent channel 20 absorb ultraviolet and infrared wavelengths of the incoming solar spectrum that are not utilized or under-utilized by the photovoltaic cell 30 as the heat transfer fluid passes through the transparent channel 20, thereby generating thermal energy. The heated stream may be connected to a conventional heat exchanger common to CSP systems and used to store thermal energy or to create steam. Alternatively, the thermal energy could be used directly in a process application.

The visible wavelengths of the incoming solar spectrum pass through the transparent channel 20 and impact the photovoltaic cell 30, which converts the photons in the visible wavelengths to electrical energy. The photovoltaic components may be directly connected to a load, an inverter to convert to AC electricity, or a battery for electrical energy storage.

Although heating of the photovoltaic cell 30 is limited because of the solar filtering that occurs in the transparent channel 20, some heat is still generated in the photovoltaic cell 30. Because the photovoltaic cell 30 is attached to the metal extrusion device 40, heat from the photovoltaic cell 30 is transferred to the heat transfer fluid in the extrusion channel 50, thereby cooling the photovoltaic cell 30. In addition, in coupled apparatus, this transfer provides an initial temperature increase to the heat transfer fluid before it enters the transparent channel 20. The incident flux is provided by a form of optical concentration in order to achieve temperatures that are useful for the generation of electricity when coupled with an organic or steam Rankine cycle or for industrial process heat.

Figure 10:
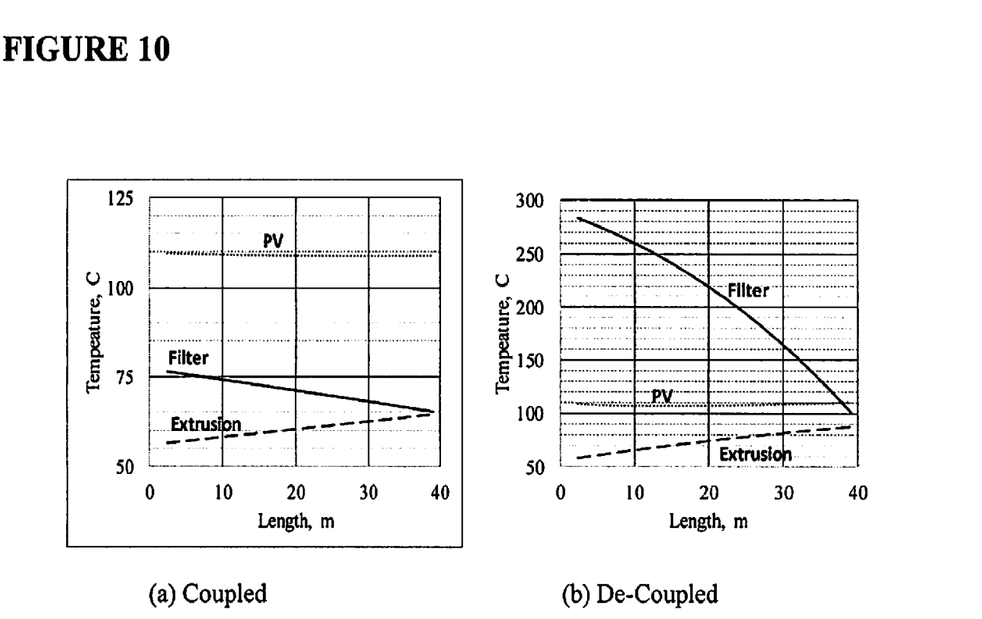
FIG. 10 illustrates temperature profiles of the photovoltaic cell, fluid in the extrusion channel, and fluid in the transparent channel as a function of length for (a) coupled and (b) de-coupled apparatus under identical operating conditions.

The apparatus 10 can be operated with the same heat transfer fluid flowing through the extrusion channel 50 and the transparent channel 20 at the same rate. However, as described below and shown in FIG. 10, this apparatus is less efficient. Alternatively, the transparent channel 20 and the extrusion channel 50 may be de-coupled. In a de-coupled apparatus, the flow rate in the extrusion channel 50 is different than the flow rate in the transparent channel 20, and different fluids may be used in each channel. Different flow rates and/or fluids may optimize the performance of the apparatus, although a separate heat exchanger is required to transfer heat from one fluid stream to the other.

The de-coupled apparatus has greater efficiency due to the different heat transfer needs of the extrusion channel 50 and the transparent channel 20. The fluid in the extrusion channel 50 helps to cool the photovoltaic cell 30, which is best achieved with turbulent flow to maximize the heat transfer coefficient. In the example in FIG. 10, glycol was used as the heat transfer fluid in the extrusion channel 50 because it has low viscosity, is capable of surviving the maximum temperature that is likely to be reached in the extrusion channel without degrading, and is significantly cheaper than heat transfer fluids that can survive higher temperatures. In contrast, the transparent channel 20 is designed to maximize heat collection (and thus minimize loss), which drives the configuration to a laminar flow regime to minimize convective losses.

Other features that may improve performance include coating the outer surface 25 of the transparent channel 20 with a low emissivity coating, such as indium tin oxide, to minimize heat loss, coating the base of the metal extrusion device 40 with an anti-reflective coating to minimize reflection off interfaces between the transparent surface and the air or fluid, and insulating the sides of the transparent channel 20 and extrusion channel 50 to reduce heat loss to the atmosphere.

EXAMPLE

An apparatus representative of the configurations shown in FIGS. 2-4 was designed using gallium arsenide (GaAs) and silicon (Si) solar cells. The heat transfer fluid flowing through the extrusion channel 50 is Dowtherm® SR-1 (The Dow Chemical Company, Midland, Mich.), which is an ethylene glycol-based fluid with low viscosity at relatively low temperatures resulting in high convective heat transfer properties. The transparent channel 20 houses the nanoparticles suspended in Duratherm S (Duratherm, Jacksonville, Fla.). The transparent channel 20 is mechanically fixed to the metal extrusion device 40 which is made of aluminum. The distance between the transparent channel 20 and the photovoltaic cell 30, which is laminated on the front of the metal extrusion device 40, is 10 millimeters (mm). The maximum width of the transparent channel 20 is 156 mm, and the optical path length of the transparent channel 20 is 10 mm.

Parametric sweeps were conducted to investigate the effect of concentration ratio and mass flow in the transparent channel 20 for the purpose of optimizing the performance of the apparatus. Results are based on laboratory-synthesized particles suspended in Duratherm S. Depending upon the configuration, gold nanospheres, gold nanorods, and indium tin oxide nanoparticles are used to absorb ultraviolet and near-infrared light while remaining highly transparent through the visible solar spectrum. The parameters and constants used in thermal modeling in this example are:

| Property | Value |
| --- | --- |
| Node length | 2.442 m |
| Inner glass emissivity | 0.9 |
| Outer glass emissivity | 0.5 |
| PV emissivity | 0.9 |
| Cold side temperature | 292.2 K |

Figure 11:
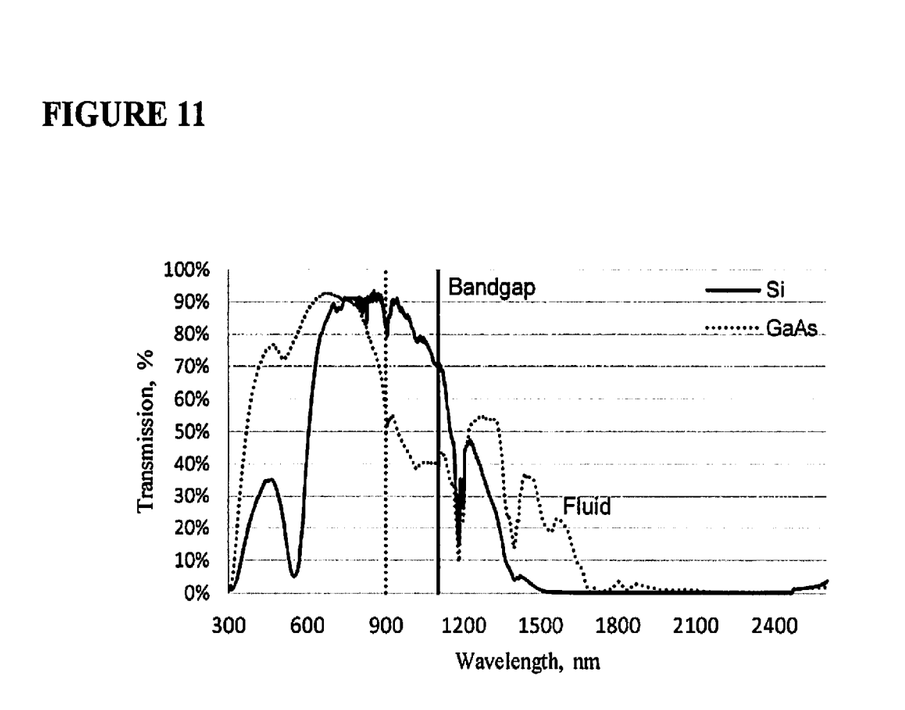
FIG. 11 illustrates the transmission spectrally selective fluid used for the GaAs— and Si-based apparatus of the example.

FIG. 11 includes the bandgap of both GaAs and Si photovoltaic cells at temperatures of 55° C., which is the lowest observed temperature of the photovoltaic cell and is for measured fluid optical properties. The concentration ratio and fluid flow rates are independent variables which effect the efficiency of the photovoltaic cell, thermal efficiency, and fluid temperatures. These parameters are used to quantify the energy available as exergy and the percent of exergy as heat. Apparatus performances were quantified for concentration ratios varying between 14× to 26× in increments of 2×, while the mass flow rate of the transparent channel varied from 0.02 kilogram per second (kgs$^{-1}$) to 0.4 kgs$^{-1}$ in increments of 0.02 kgs$^{-1}$. The length of the apparatus was held constant at 40 meters because apparatus performances were not found to increase beyond this length.

Figure 12:
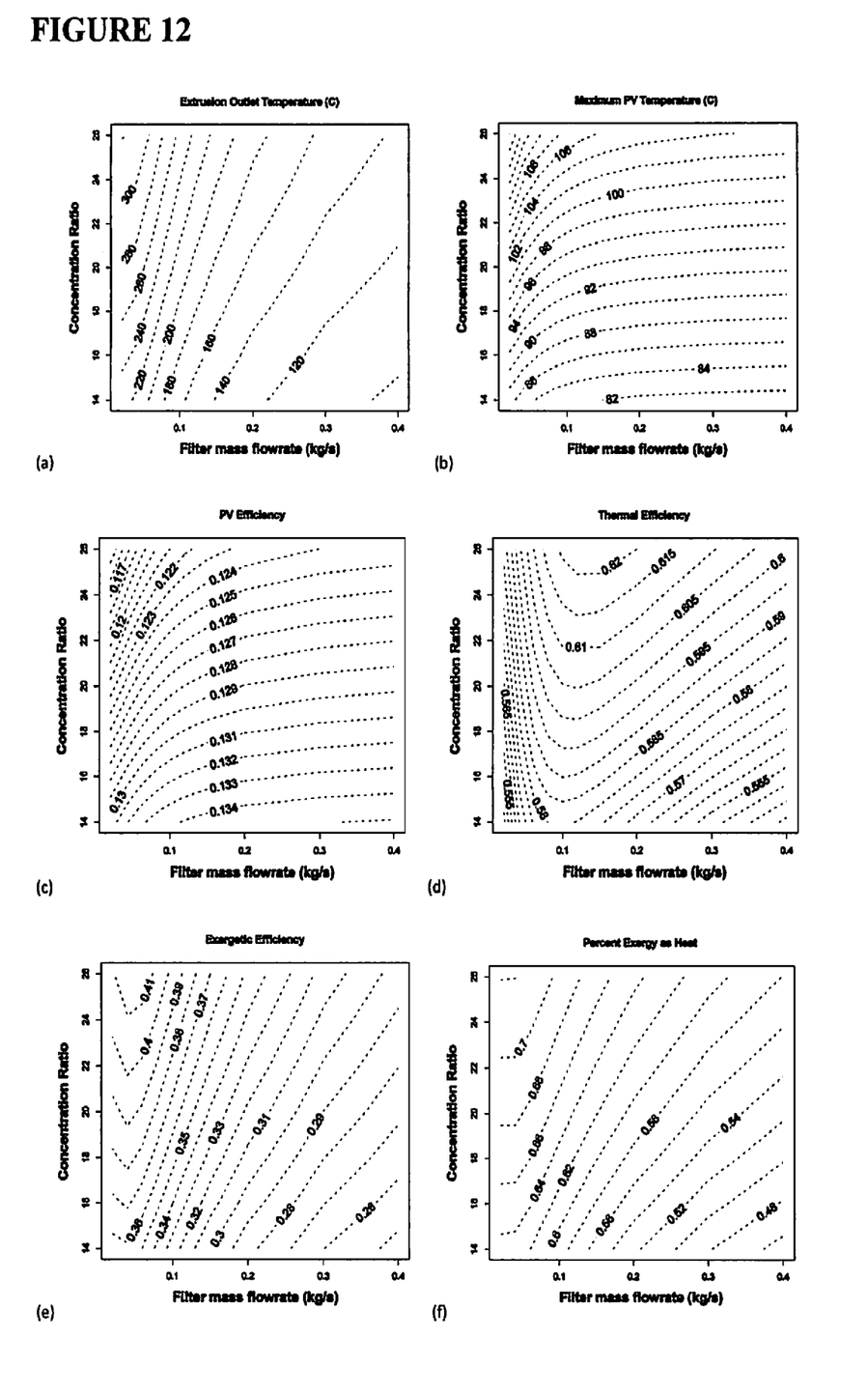
FIG. 12 illustrates the parametric sweeps associated with the apparatus of the example, with GaAs as the photovoltaic material.
Figure 13:
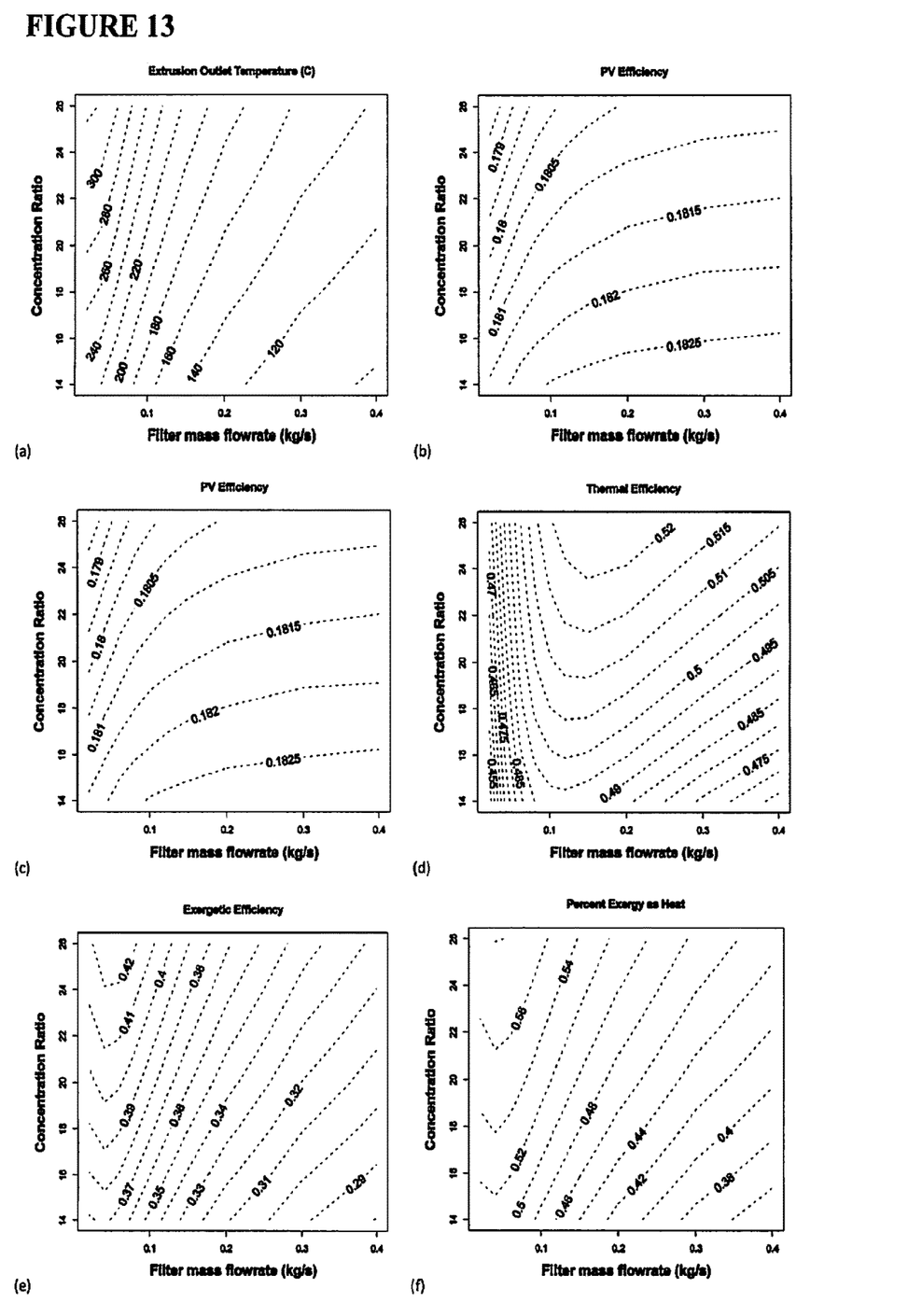
FIG. 13 illustrates the parametric sweeps associated with the apparatus of the example, with Si as the photovoltaic material.

The results for the GaAs and Si parametric sweeps are shown in FIG. 12 and FIG. 13, respectively. These plots present the outlet temperature, maximum temperature of the photovoltaic cell, efficiency of the photovoltaic cell, thermal efficiency, exergy efficiency, and percent exergy as heat. The outlet temperature of the heat transfer fluid in the transparent channel is shown to be highly dependent on the concentration ratio and mass flow rate.

The preferred embodiments described here are not all possible embodiments of the apparatus and method for the co-production of high temperature thermal energy and electrical energy from solar irradiance. The invention itself is defined by the following claims, and includes elements or steps equivalent to those recited in the claims.

What is claimed:

1. An apparatus (10) for co-production of high temperature thermal energy and electrical energy from solar irradiance, the apparatus (10) comprising:
    a transparent tube;
    a photovoltaic cell (30) laminated to a metal extrusion device (40), the metal extrusion device (40) containing an extrusion channel (50) configured for turbulent flow through which a first heat transfer fluid flows, said photovoltaic cell in said transparent tube, said photovoltaic cell having a concave or V-shaped surface for receiving the solar irradiance;

a transparent channel (20) between the photovoltaic cell (30) and a solar energy source, the transparent channel (20) configured for laminar flow and containing a second heat transfer fluid seeded with particles chosen from the group consisting of metallic nanoparticles, semiconducting nanoparticles, and non-metallic nanoparticles, said second heat transfer fluid for absorbing a portion of the solar irradiance as said solar irradiance passes through said transparent channel;

said concave or V-shaped surface for reducing reflection losses and for maximizing back reflection into said transparent channel;

a first portion of the solar irradiance being converted to electrical energy by the photovoltaic cell (30) and a second portion of the solar irradiance being absorbed as heat by the second heat transfer fluid.

2. An apparatus (10) according to claim 1, wherein a nanoparticle type of the particles is selected based on photovoltaic cell band gap and a desired ratio between thermal and electrical outputs; and wherein a nanoparticle concentration of the particles is based on strength with which the selected nanoparticle type absorbs solar energy, wavelength for peak absorption, and optical path length of the transparent channel (20).

3. An apparatus (10) according to claim 1, wherein the extrusion channel (50) is coupled to the transparent channel (20) via a pipe.

4. An apparatus (10) according to claim 1, wherein the first heat transfer fluid of the extrusion channel (50) has a flow rate different than that of the second heat transfer fluid of the transparent channel (20).

5. An apparatus (10) according to claim 1, wherein the apparatus (10) is supported by a structure that allows for tracking of solar energy.

6. An apparatus (10) according to claim 1, wherein the transparent channel (20) is comprised of glass or clear plastic.

7. An apparatus (10) according to claim 1, wherein the metal extrusion device (40) is comprised of aluminum.

8. An apparatus (10) according to claim 1, wherein the transparent channel (20) is comprised of a plurality of segments.

9. An apparatus (10) according to claim 1, further comprising a gap between the transparent channel (20) and the metal extrusion device (40), the p comprised of a vacuum.

10. An apparatus (10) according to claim 1, wherein one or more surfaces of the transparent channel (20) may have an anti-reflection coating or a low emissivity coating.

11. An apparatus (10) according to claim 1, wherein sides of the transparent channel (20) are insulated.

12. An apparatus (10) according to claim 1, wherein the transparent channel (20), metal extrusion device (40), and photovoltaic cell (30) are located inside said transparent tube (80);

wherein said transparent channel is adjacent said transparent tube on a first side; and wherein said photovoltaic cell and said metal extrusion device partially surround said transparent tube on a second side for receiving light passing through said transparent channel.

13. A method for co-production of high temperature thermal energy and electrical energy from solar irradiance, the method comprising:

providing an apparatus (10) comprised of a transparent channel (20) between a concave or V-shaped surface photovoltaic cell (30) and a light source directed to said concave or V-shaped surface of said photovoltaic cell, the photovoltaic cell (30) being laminated to a metal extrusion device (40) including an extrusion channel (50) wherein the transparent channel (20) and photovoltaic cell (30) are housed in a transparent tube (80);

passing a first heat transfer fluid through the extrusion channel (50) in the metal extrusion device (40);

passing a second heat transfer fluid through the transparent channel (20) with laminar flow, the second heat transfer fluid seeded with particles chosen from the group consisting of metallic nanoparticles, semiconducting nanoparticles, and non-metallic nanoparticles, said second heat transfer fluid for absorbing a second portion of solar energy as said solar energy passes through said transparent channel;

reflecting light from said concave or V-shaped surface into said transparent channel;

exposing the apparatus (10) to said light source, converting a first portion of energy from said light source to electrical energy by the photovoltaic cell (30); and cooling the photovoltaic cell by way of a second portion of the solar energy being absorbed as heat by the second heat transfer fluid.

14. A method according to claim 13, further comprising connecting the second heat transfer fluid exiting the transparent channel (20) to a conventional heat exchanger or using it directly in a process application.

15. A method according to claim 13, further comprising:

selecting a nanoparticle type of the particles based on photovoltaic cell band gap and a desired ratio between thermal and electrical outputs; and selecting a nanoparticle concentration of the particles based on strength with which the selected nanoparticle type absorbs solar energy, wavelength for peak absorption, and optical path length of the transparent channel (20).

16. A method according to claim 13, further comprising transferring heat from the photovoltaic cell (30) to the first heat transfer fluid in the extrusion channel (50).

17. A method according to claim 13, wherein the first heat transfer fluid in the extrusion channel (50) is different than the second heat transfer fluid in the transparent channel (20).

18. A method according to claim 13, wherein rates of fluid flow in the extrusion channel (50) and the transparent channel (20) are different.

19. An apparatus for co-production of thermal energy and electrical energy from a light energy source, the apparatus comprising:

a transparent tube;

a transparent channel inside of said transparent tube;

a. heat transfer fluid in said transparent channel, said heat transfer fluid seeded with particles chosen from a group consisting of metallic nanoparticles, semiconducting nanoparticles, and non-metallic nanoparticles, said heat transfer fluid for absorbing a first portion of a spectrum of light emanating from the light energy source as said light passes through said transparent channel and through said heat transfer fluid, wherein energy from said first portion of said spectrum of light is absorbed in said heat transfer fluid as heat;

a photo-voltaic cell having a concave curved or V-shaped surface located within the transparent tube to receive light from said light energy source that has passed through said transparent channel and said heat transfer fluid, said light converted to electrical energy by said photo-voltaic cell, said concave curved or V-shaped surface for reducing reflection losses and for maximizing back reflection into said transparent channel;

a metallic device in communication with said photo-voltaic cell, said metallic device defining an extrusion channel configured to induce turbulent flow of contents of said extrusion channel.

\* \* \* \* \*

UNITED STATES PATENT AND TRADEMARK OFFICE
CERTIFICATE OF CORRECTION

PATENT NO. : 11,125,469 B2
APPLICATION NO. : 16/074954
DATED : September 21, 2021
INVENTOR(S) : Todd P. Otanicar, Drew DeJarnette and Nick Brekke It is certified that error appears in the above-identified patent and that said Letters Patent is hereby corrected as shown below:

In the Specification

Column 1, Line 15, insert the paragraph and section header:
--STATEMENT REGARDING FEDERALLY SPONSORED RESEARCH OR DEVELOPMENT
This invention was developed with the assistance of the Advanced Research Projects Agency –
Energy (ARPA-E) grant DE-AR0000463. The U.S. Government may have rights in this invention.--

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*